United States Patent [19]

Schiebel et al.

[11] 4,389,610
[45] Jun. 21, 1983

[54] ELECTROSTATIC PROBE DEVICE AND METHOD OF MANUFACTURING SUCH A DEVICE

[75] Inventors: Ulrich Schiebel, Aachen-Brand; Dieter Wädow, Aachen-Hahn, both of Fed. Rep. of Germany

[73] Assignee: U.S. Philips Corporation, New York, N.Y.

[21] Appl. No.: 210,954

[22] Filed: Nov. 28, 1980

[30] Foreign Application Priority Data

Dec. 4, 1979 [DE] Fed. Rep. of Germany ....... 2948660

[51] Int. Cl.³ ............................................. G01R 31/02
[52] U.S. Cl. .................................... 324/72.5; 324/446
[58] Field of Search ................... 324/72.5, 158 P, 149, 324/457, 458

[56] References Cited

U.S. PATENT DOCUMENTS 3,508,148 4/1970 Enfield ................................ 324/446
4,318,042 3/1982 Eda et al. ........................... 324/72.5

Primary Examiner—Michael J. Tokar
Attorney, Agent, or Firm—Paul R. Miller

[57] ABSTRACT

In electrophotography or electroradiography charge images are formed which are customarily made visible by means of toners. The invention provides an electrostatic probe device for the electric scanning of charge images. The device, therefore, is particularly suitable for use in conjunction with digital image processing and storage. The device in accordance with the invention comprises a large number of electrode tracks which are provided on a flat substrate and on which there is provided an insulating layer on which a conductive layer is provided. The latter layer comprises cut-outs at the area of the electrostatic probe electrode heads. This device is suitable for the simultaneous measurement of the charge distribution at some hundreds of measuring locations.

15 Claims, 4 Drawing Figures

ELECTROSTATIC PROBE DEVICE AND METHOD OF MANUFACTURING SUCH A DEVICE

The invention relates to an electrostatic probe device for measuring charge distributions on an electrically charged surface which comprises a probe electrode head and a grounded screening electrode, and also relates to a method of manufacturing such an electrostatic probe device.

In electrophotography or electroradiography, electrostatic (latent) charge images are formed which are customarily made visible by means of electrically charged pigment particles (toners).

It is alternatively possible to scan the charge images electronically by means of electrostatic probes in order to make the image information accessible, for example, for image processing in a computer; this is particularly advantageous in the case of quantitative evaluation of images.

The image carriers on which the charge distribution is present (for example, selenium plates or the like) must then be scanned by means of electrostatic probes whose effective measuring surface area on which charges are influenced, the so-called probe electrodehead, is very small (for example, $100 \times 100$ $\mu m^2$). In the magazine "Journal of Physics E", Vol. 4, 1971, pages 362–365, and also Vol. 6, 1973, pages 472–474, electrostatic probes which have a correspondingly small probe electrode head surface area are described. The number of image points to be scanned in electrophotography or electroradiography would be very large ($10^6$ to $10^7$), so that rational scanning would be possible only if a large number of such probes were used.

The probe electrode of the known electrostatic probe devices consists of a wire which is directed perpendicularly to the surface to be scanned and which is enveloped by a concentric collar, separated by an insulating layer, which serves as a screening electrode. A screening electrode of this kind is necessary for obtaining a suitable spatial resolution during the scanning of a charge distribution.

The series manufacture of an electrostatic probe device comprising a large number of such coaxial probe electrodes will be very problematic and expensive. Problems will arise especially at the insulation between the probe electrode and the screening ring. Moreover, it will also be hardly possible to mount a large number of such electrostatic probes in close packing in a straight line, because the screening electrodes preclude such a close packing. Large problems will also be encountered in mounting the individual electrostatic probes so that the probe electrode heads are always at the same distance from the surface to be scanned. Therefore, the known electrostatic probes are not suitable for use in an electrostatic probe device comprising a large number of electrostatic probes.

The invention has for its object to provide an electrostatic probe device comprising a large number of electrostatic probes. Using an electrostatic probe device of the kind set forth, this object is achieved in that on an electrically insulating substrate there are provided a large number of adjacently arranged, mutually insulated electrode tracks which serve as probe electrodes. On the electrode tracks, there are provided at least at the area of the probe electrode heads, a coherent insulating layer, and on the insulating layer there is provided an electrically conductive cover player layer which has an opening for each probe electrode at the area of the probe electrode head. The electrically conductive layer which is provided on the insulating layer and which includes the openings performs the function of a screening electrode for all probe electrodes. This layer is grounded during operation.

Thus, the coaxial construction of the electrostatic probe in the electrostatic probe device in accordance with the invention is replaced by a planar multilayer construction. The manufacture is very simple, because it is only necessary to deposit a few layers (electrode track, insulating layer and conductive layer) on a substrate in order to realize a large number of electrostatic probes.

The part of the substrate on which the probe electrode heads are arranged must be sufficiently flat in order to ensure that all electrode heads are situated at the same distance from the surface to be scanned. When the electrode heads are arranged in one or two linear rows, this requirement can also be satisfied by using a cylindrical-lens-shaped substrate and by arranging the row of electrode heads in the direction of the cylinder axis.

In a device in accordance with the invention, no insulation problems are encountered if the insulating layer is sufficiently thick and a suitable insulator is used, for example, silicon oxide ($SiO_2$).

The space between two probe electrode heads must be just so large that the leakage currents flowing therebetween are negligible. A comparatively close packing (in one direction) of the electrostatic probes is then possible.

The space between two probe electrode heads, obviously, may not be zero. Consequently, if the probe electrode heads were arranged in a single row (i.e. if the connecting line between their centers would be a straight line) and if the electrostatic probe device were displaced parallel to the surface to be scanned and perpendicularly to this row, strips whose charge was not taken up would remain on the surface to be scanned. This drawback is avoided by a further elaboration of the invention in that there are provided two groups of probe electrodes, the probe electrode heads of each group being situated on a straight line with the lines extending in parallel at a short distance from each other. The remaining part of the probe electrodes extend each time on one of the remote sides of the straight line, and the probe electrodes of a group are spaced apart in the direction of the straight line over a distance which corresponds to twice the dimension of an opening in this direction. The probe electrodes of both groups are shifted in this direction over a distance which corresponds to the dimension of an opening with respect to each other.

In a further embodiment in accordance with the invention, the substrate comprises a flat surface in a plane in which the probe electrode heads are provided. This plane is bounded by two flat, slanted side planes which intersect each other in a straight line outside the substrate. As a result of this construction it is achieved that the surface comprising the probe electrode heads can be brought nearest to the surface when the charge distribution of a flat surface is scanned, while the parts of the probe electrodes arranged on the slanted side surfaces are situated at a greater distance from the surface to be scanned. Therefore, they cannot have a disturbing effect on the charge distribution to be scanned, and additional components, for example, high-ohmic preamplifiers may be arranged on the side surfaces.

The electrostatic probe device in accordance with the invention can be simply manufactured by first depositing a first conductive layer on the substrate, the electrode tracks being subsequently formed therein by etching after which an insulating layer is deposited on the etched first conductive layer, after which thereon a second conductive layer is provided in which the openings are formed by etching.

Alternatively, the electrostatic probe device can be particularly simply manufactured by metallizing a thin, flexible, electrically insulating foil (for example, polyimide having a thickness of 25 μm) on both sides, by subsequently forming the electrode tracks on the one side by etching of the metal layer, by etching openings which define the probe electrode heads into the metal layer on the other side, and by stretching or glueing the foil thus treated on an electrically insulating substrate having a suitable shape.

The invention will be described in detail hereinafter with reference to an embodiment shown in the drawing.

The electrostatic probe device is not shown to scale in order to enhance the clarity of the important characteristics of the invention.

Figure 1:
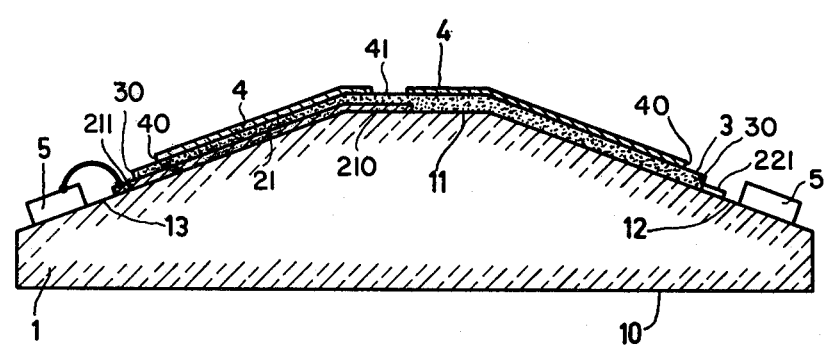
FIG. 1 is a sectional view of an electrostatic probe device.

The reference numeral 1 in FIG. 1 denotes a substrate which is made of quartz glass and which has a flat base surface 10 having a width of 20 mm (the dimensions in the horizontal direction) and on top thereof a parallel flat surface 11 in the center having a width of approximately 2 mm. The surface 11 is adjoined in the lateral direction by two slanted side surfaces 12 and 13 which enclose an angle of, for example, 20° and 160°, respectively, with respect to the surface 11 and which intersect each other in a straight line above the surface 11.

The substrate need not necessarily be made of quartz glass. It is only important that its surface has a very low electrical conductivity and that it has an adequate thermal strength in order to withstand the deposition of the various layers, without being modified.

The substrate has the cross-section shown in FIG. 1 over its full length of, for example, 50 mm, i.e. in the direction perpendicular to the plane of the drawing.

During a first step, an electrically conductive layer of, for example, aluminium having a thickness of 100 nm is deposited on the substrate 1. Deposition is realized by way of sputtering, but could in principle also be vapour deposition. Subsequently, from the layer thus formed on the surfaces 11, 12 and 13, the probe electrodes are formed by etching, using a flat photomask which, however, takes into account the inclination of the side surfaces, by way of customary photolithographic methods. The device shown in FIG. 2a is thus formed.

Figure 2A:
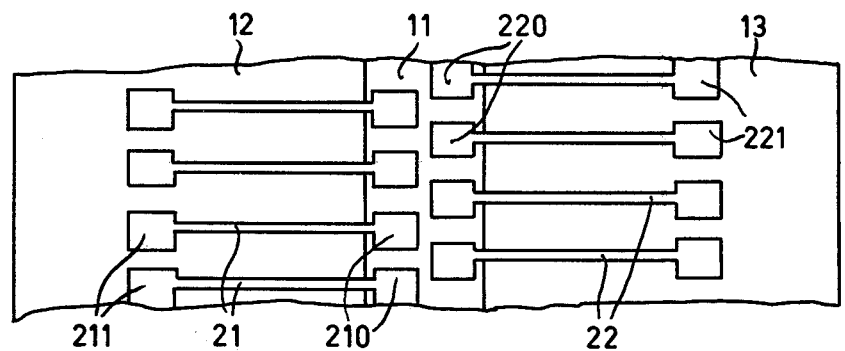
FIGS. 2a to FIG. 2c show a plan view of a part of the electrostatic probe device in different phases of the manufacturing process.

FIG. 2a shows two groups of probe electrodes 21 and 22, respectively. The probe electrodes 21 comprise electrode heads 210 which are arranged on the flat surface 11 and whose dimensions amount to approximately 100×100 μm². When the centers of these electrodes heads are aligned, a straight line is produced which is situated to the left of the center of the flat surface 11. The group of probe electrodes extends towards the left side surface 12 and the electrodes comprise connection surfaces 211 at their ends for the electrical connection of the probe electrodes. The probe electrodes 21 extend approximately perpendicularly to the straight line of the probe electrode heads and the symmetry lines are situated at a distance from each other which distance corresponds approximately to twice the dimension of a probe electrode head in the longitudinal direction. The other group of probe electrodes 22 comprises electrode heads 220 which are arranged on the flat surface 11 but the centers of the probe electrode heads 220 are situated along a straight line which is situated slightly further to the right than the straight line of the probe electrode heads 210 and parallel thereto. The probe electrodes 22 extend to the right, so they are present mainly on the right side surface 13 on which the connection surfaces 221 are also present. The group of probe electrodes 22 is shifted over half the distance between two probe electrodes of a group with respect to the group of probe electrodes 21 in the longitudinal direction (i.e. in the vertical direction in FIG. 2a). The two probe electrode groups, however, have an identical construction.

Figure 2B:
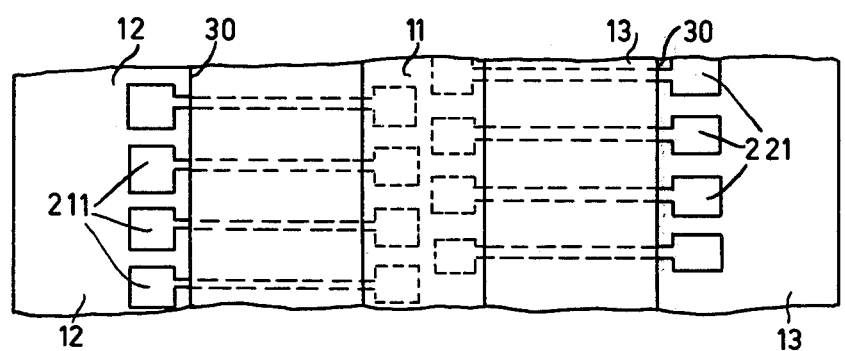

During a second phase, an insulating layer 3 of silicon dioxide ($SiO_2$) is deposited on the surfaces 11, 12, 13, the edges of which are denoted by the reference numeral 30 in FIG. 2b, said layer just leaving exposed the connection faces 211 and 221 of the probe electrodes situated therebelow. The silicon dioxide layer having a thickness of approximately 1 μm can again be deposited by cathode sputtering. The thicker this layer is, the better the insulation will be between the probe electrode and the screening electrode and the lower will be the capacitances between these two electrodes.

Figure 2C:
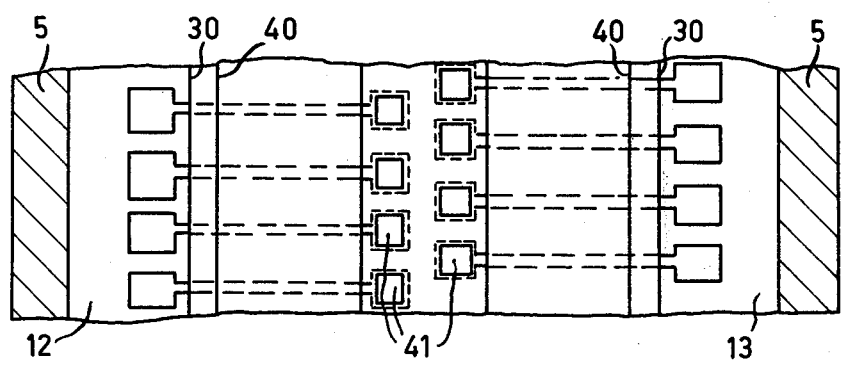

During a third production phase, an electrically conductive cover layer 4 of, for example, aluminium is provided on the insulating layer 3. Deposition can again be realized by sputtering. This cover layer, whose edge is denoted by the reference numeral 40 in FIG. 2c, leaves the area at the edges 30 of the insulating layer 3 exposed, so that between the cover layer and the connection pads an adequate insulating path is present. Subsequently, in the cover layer having a thickness of, for example, 200 nm openings 41 are etched each time at the area over the probe electrode heads during a further photolithographic phase, the size of the openings corresponding to the size of the probe electrode heads, thus defining the size of these heads.

On the side surfaces 12 and 13 there may be provided high-ohmic amplifier stages which are preferably constructed according to the integrated circuit technique, for each probe electrode there being provided an amplifier stage whose input electrode is connected to one of the connection pads 221 and 211, respectively, and whose second input carries the same potential during operation as the conductive cover layer 4, i.e. it is grounded. These amplifier stages are diagrammatically shown in FIG. 1 and are denoted by the reference numeral 5.

For the scanning of a flat surface, the surface 11 is positioned at a distance of, for example, 50 μm from the surface to be scanned, charge carriers being influenced on the probe electrodes through the apertures 41 in the cover layer 4, so that on the output of the connected amplifier stage a voltage is generated which is proportional to the number of influenced charge carriers and hence the charge in the oppositely situated area of the charged surface. When the charge distribution along a row defined by the straight line of the electrode heads 210 or 220, has thus been determined, the electrostatic probe device can be displaced perpendicularly to the direction of the row in order to measure the charge distribution of a new section.

In addition to the advantages (high local resolution, rational manufacturing, etc.), the electrostatic probe device in accordance with the invention also offers the following advantages. Between a probe electrode and the cover layer, acting as a screening electrode, small capacitances ($\leq 4$ pF) occur. Extremely small capacitances appear between two adjacently situated probe electrodes; the cross-talk caused thereby can be kept smaller than 2%. A one-dimensional close packing of probe electrodes is possible. The probe electrode heads are arranged exactly in one plane, so that the adjustment of the distance with respect to the flat surface whose charge distribution has to be determined can be simultaneously performed for all probe electrodes on a substrate.

What is claimed is:

1. An electrostatic probe device for measuring charge distribution on an electrically charged surface comprising
   an electrically insulating substrate,
   a plurality of adjacent, mutually insulated, and mutually extending electrostatic probe electrodes on said substrate, each of said probe electrodes including a probe electrode head, an electrode track, and a connection electrode surface,
   a coherent insulating layer provided over at least said probe electrode head of said probe electrodes, and
   an electrically conductive cover layer provided on said insulating layer, said cover layer having an opening over said probe electrode head of each of said probe electrodes.

2. An electrostatic probe device according to claim 1, wherein said probe electrodes at the area of said probe electrode head are provided in a straight line on said substrate.

3. An electrostatic probe device according to claim 2, wherein said probe electrodes extend parallel to each other, and transversely to said straight line.

4. An electrostatic probe device according to one of claims 1, 2 or 3, wherein two groups of said probe electrodes are disposed on said substrate with said probe electrode heads of each of said two groups situated on a straight line with respective straight lines of each group being parallel and separated at a small distance from each other, said probe electrodes of each of said two groups extending away from said straight lines in opposite directions, and wherein said probe electrodes of each of said two groups are spaced apart in the direction of respective said straight lines at a distance corresponding to approximately twice the dimension of said openings in said cover layer in said direction, said probe electrodes of said two groups being shifted relative to one another along said straight lines by half of the distance between two probe electrodes.

5. An electrostatic probe device according to claim 4, wherein said substrate includes a first flat surface on which said probe electrode head of each of said probe electrodes is provided, and two flat, slanted side surfaces bounding said first surface and intersecting one another in a line outside said substrate.

6. An electrostatic probe device according to claim 4, wherein said substrate has a cylindrical shape, and said probe electrode head of said probe electrodes are arranged in at least one row in the direction of the cylinder axis.

7. An electrostatic probe device according to claim 4, wherein said substrate consists of quartz glass.

8. An electrostatic probe device according to claim 4, wherein said insulating layer consists of $SiO_2$.

9. An electrostatic probe device according to one of claims 1, 2 or 3, wherein said substrate includes a first flat surface on which said probe electrode head of each of said probe electrodes is provided, and two flat, slanted side surfaces bounding said first surface and intersecting one another in a line outside said substrate.

10. An electrostatic probe device according to one of claims 1, 2 or 3, wherein said substrate has a cylindrical shape, and said probe electrode head of said probe electrodes are arranged in at least one row in the direction of the cylindrical axis.

11. An electrostatic probe device according to one of claims 1, 2 or 3, wherein said substrate consists of quartz glass.

12. An electrostatic probe device according to one of claims 1, 2 or 3, wherein said insulating layer consists of $SiO_2$.

13. An electrostatic probe device according to claim 1, wherein said plurality of probe electrodes includes a very large number of probe electrodes.

14. A method of manufacturing of electrostatic probe device as claimed in claim 1, comprising the steps of depositing a first conductive layer on said substrate, etching said conductive layer to form said plurality of probe electrodes, depositing an insulating layer on the etched conductive layer, providing a second conductive layer on said insulating layer to form said cover layer, and forming said openings in said second conductive layer by etching.

15. A method of manufacturing an electrostatic probe device as claimed in claim 1, comprising the steps of metallizing both sides of a thin flexible electrically insulating foil, forming said plurality of probe electrodes on one side of said foil by etching, etching said openings at the other side of said foil, and stretching or gluing the thus treated foil onto a shaped electrically insulating substrate.

* * * * *